United States Patent [19]

Malyon

[11] 4,309,671
[45] Jan. 5, 1982

[54] CONTROL APPARATUS
[75] Inventor: Derek J. Malyon, Heath, England
[73] Assignee: The Post Office, London, England
[21] Appl. No.: 217,807
[22] Filed: Dec. 18, 1980

Related U.S. Application Data

[63] Continuation of Ser. No. 954,114, Oct. 24, 1978, abandoned.

[30] Foreign Application Priority Data

Oct. 26, 1977 [GB] United Kingdom ............... 44572/77

[51] Int. Cl.³ .............................................. H01S 3/13
[52] U.S. Cl. ............................................... 331/94.5 S
[58] Field of Search ..................... 331/94.5 S, 94.5 H; 455/608

[56] References Cited

U.S. PATENT DOCUMENTS

| | | | |
|---|---|---|---|
| 3,588,738 | 6/1971 | Goodwin | 331/94.5 C |
| 4,009,385 | 2/1977 | Sell | 331/94.5 M |
| 4,019,048 | 4/1977 | Malone et al. | 331/94.5 M |

Primary Examiner—William L. Sikes
Assistant Examiner—Léon Scott, Jr.
Attorney, Agent, or Firm—Kemon & Estabrook

[57] ABSTRACT

This invention relates to the control of the wavelength of the emission from a semi-conductor laser 1. The laser driver 5 is connected in a feedback loop comprising a beam-splitter 6, a photodiode 8 and an amplifier 19, which loop controls the driver 5 to maintain the intensity of the laser emission constant. The emission is also sampled by a beam-splitter 7 and a photodiode 9, which is made frequency-dependent by a filter 10 interposed in the path of the beam. The outputs of the matched photodiodes 8 and 9 are fed via amplifiers 11 and 13 to the positive and negative inputs of a subtractor amplifier 12, the output of which is therefore dependent only upon the emission wavelength. This output is fed as negative feedback to an amplifier 15 for controlling an operating parameter (such as the temperature) of the laser 1 to maintain the wavelength constant.

8 Claims, 2 Drawing Figures

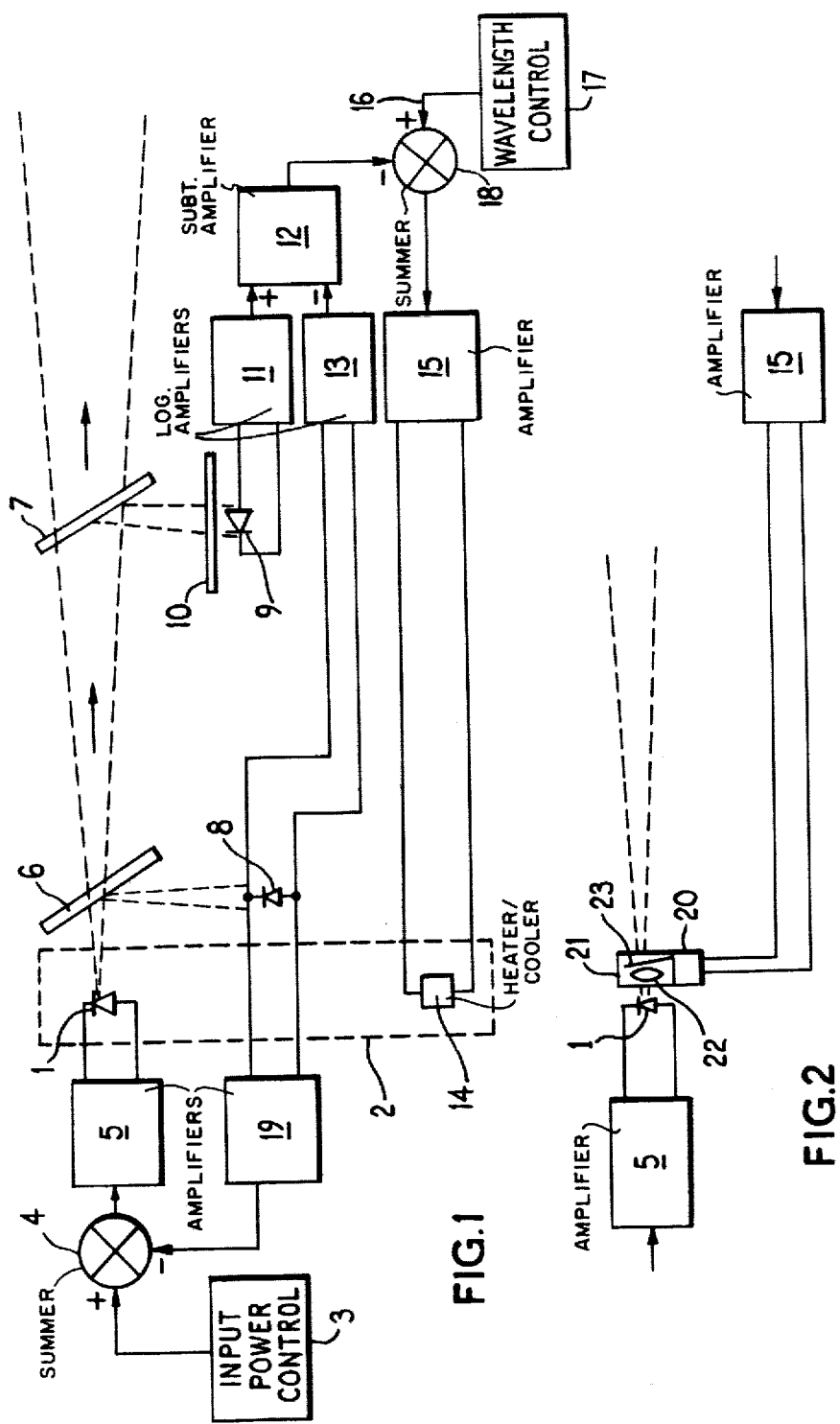

CONTROL APPARATUS

This is a continuation of application Ser. No. 954,114, filed Oct. 28, 1978, now abandoned.

This invention relates to control apparatus for semi-conductor laser devices.

There are several reasons why it is desirable to provide easy adjustment of the emission wavelength of a laser. For example, if a laser is to operate into an optical fibre, it will clearly be advantageous to be able to measure the fibre insertion loss over a range of emission wavelengths and then to set the wavelength at the value giving the lowest insertion loss. Furthermore, if a replacement laser device has to be inserted into an existing system it will be necessary to adjust the operating wavelength of the device to suit the system. In multiplexed optical carrier systems it is necessary to be able to tune a number of laser devices to selected different operating wavelengths.

It is also necessary to stabilise laser devices against drift in emission wavelength, such as temperature-dependent changes in wavelength resulting from increasing the drive signal to compensate for laser ageing.

It is an object of the present invention to provide an emission wavelength and power control and stabilisation apparatus for a semi-conductor laser device.

According to the invention, apparatus for controlling the emission wavelength and power of a semi-conductor laser device comprises a feedback loop to monitor the emission wavelength of the radiation from the laser device and to maintain the wavelength at a predetermined value by controlling an operating parameter of the laser device; and means to monitor the intensity of the constant wavelength radiation and to maintain the monitored intensity at a constant level by controlling the laser current.

Preferably, the operating parameter which is controlled is the operating temperature of the device.

Embodiments of the invention will now be described, by way of example, with reference to the accompanying drawing, in which:

FIG. 1 is a schematic diagram of one form of laser control apparatus in accordance with the invention, and FIG. 2 is a schematic diagram of an alternative form of part of the apparatus.

Referring to FIG. 1 a semi-conductor laser 1 is mounted on a heat sink 2. Input power is fed to the laser from an input power control unit 3, via a summing circuit 4 and an amplifier 5.

The optical beam from the laser 1 is passed through beam splitters 6 and 7 which divert samples of the beam to photodiodes 8 and 9, respectively. Between the beam splitter 7 and the photodiode 9 is an optical filter 10 having a positive transmission gradient versus wavelength characteristic. This filter selectively attenuates the sampled beam depending upon the wavelength of the laser emission.

The output of the photodiode 9 is fed, via a logarithmic amplifier 11, to the positive input of a subtractor amplifier 12. The output of the photodiode 8 is fed via a logarithmic amplifier 13 to the negative input of the subtractor amplifier 12.

Since the outputs of the photodiodes 8 and 9 have passed through the amplifiers 13 and 11 and are fed to the positive and negative inputs of the amplifier 12, ratiometric changes common to the photodiodes are cancelled out and do not appear at the output of the amplifier 12. Hence, the output of the amplifier 12 is independent of the intensity of the laser beam. The photodiodes 8 and 9 are selected as a matched pair, so that the output of the amplifier 12 is also independent of the spectral characteristics of the photodiodes. The output is, therefore, dependent only upon the emission wavelength of the semi-conductor laser device 1.

The emission wavelength is dependent upon the operating temperature of the device, and therefore upon the temperature of the heat sink 2. The temperature coefficient of a typical device is approximately $+0.4$ nm/° K.

The heat sink temperature is controlled by a heating or cooling element 14 which is energised from an amplifier 15 controlled by a control line 16 from a wavelength control unit 17. The voltage on the line 16 is fed to the positive input of a summing circuit 18. The voltage is set to give the heat sink temperature corresponding to a required emission wavelength.

The element 14 may be a heating element comprising a transistor dissipating, say, approximately 1 watt.

The output of the subtractor amplifier 12 is fed to the negative input of the circuit 18, so that that output acts as a negative feedback, in opposition to the control voltage on the line 16. This feedback loop therefore controls the temperature of the heat sink 2, thereby maintaining the emission wavelength constant, so that wavelength drift is compensated for.

Since the sampled beam directed at the photodiode 8 has a constant wavelength, any change in the output from the photodiode 8 must be due to a change in intensity of the beam.

The output of the photodiode 8 is fed to an amplifier 19, and the amplified signal is fed to the summing circuit 4 to act as a negative feedback for the amplifier 5, i.e. in opposition to the voltage from the input power control unit 3. This feedback loop therefore controls the laser current, keeping the beam intensity constant at a predetermined level.

The optical intensity of the laser device may decrease during the lifetime of the device. This is compensated for by increasing the drive signal input to the amplifier 5. However, this would also cause an increase in the laser junction/heat sink temperature and hence cause a change in the emission wavelength. The control circuit of the present invention will pull the wavelength back to the predetermined value by decreasing the amount of electrical power fed to the element 14 by the amplifier 15. Hence, the temperature of the laser junction will remain at that level required to initiate the given emission wavelength.

If it is necessary deliberately to change the intensity, this can be achieved by adjustment of the voltage on the line from the input power control 3.

If it is necessary deliberately to change the emission wavelength, this can be achieved by adjustment of the voltage on the line 16. Additionally, the optical intensity would have to be readjusted to its predetermined level, since the photodiode 8 is spectrally dependent.

The two photodiodes may advantageously be identical devices formed on the same header.

For the feedback networks, given a large forward gain A and a feedback gain B of magnitude such that $B \times A$ is much greater than unity, it can be shown that the output is $1/B$ times the input. The output stability is given by (change in output) / output $= -$ (change in $B$)/$B$ and where the main instability in the feedback network is in the photodiodes it can be shown that changes common to the two photodiodes, i.e. ageing, temperature stability, quantum efficiency, etc., are cancelled at the output of the amplifier 12. A change at that output therefore occurs only when the emission wavelength varies. The laser wavelength control and stabilisation is therefore independent of any variations in the photodiode parameters.

If the laser 1 has to be replaced due, for example, to damage or ageing, a similar device can be inserted, and the circuit will automatically set the wavelength and intensity of emission of the new device at the same levels as the old device.

Although the wavelength control is described above in relation to the control of the operating temperature of the laser 1, other operating parameters, such as the application of mechanical pressure or the application of a magnetic field, or any combination of such parameters, may be controlled.

FIG. 2 shows one example of a modified form of wavelength control for use in the FIG. 1 embodiment. Instead of feeding the output of the amplifier 15 to the heat sink temperature control element 14, the output is fed to a piezo-electric crystal 20. A resonant cavity 21 at the output of the laser comprises a lens 22 and an optical grating 23 in the path of the beam. The crystal 20 is arranged to set the angle of the grating 23 relative to the axis of the beam, and to vary said angle in dependence upon the voltage applied to the crystal from the amplifier 15. Variation of the angle changes the tuning of the laser and acts as a wavelength control. The use of the optical grating also reduces the laser line width from approximately 4 nm. to approximately 0.1 nm. This reduction allows a considerable increase in the number of lasers which can be used together in a multiplex system.

All of the other components of the apparatus can be as shown in FIG. 1.

I claim:

1. In combination: a semiconductor laser; and apparatus for controlling the intensity and wavelength of light emitted by said laser, said wavelength being determined by an operating parameter of said laser; said apparatus comprising:
   means to supply drive current to said laser to cause said laser to emit light;
   a first photodiode to receive light emitted by said laser and to produce a first electrical output signal in dependence upon the intensity of said emitted light received thereby;
   current control means responsive to said first electrical output signal and coupled to said drive current supply means to control said drive current supplied to said laser to maintain said intensity of said emitted light substantially constant;
   emission-responsive means, comprising a second photodiode and a wavelength-dependent filter interposed between said second photodiode and said laser, to receive light emitted by said laser and to produce a second electrical output signal which varies in dependence upon said wavelength of said emitted light received thereby;
   and means responsive to said second output signal to control said parameter of said laser to maintain said wavelength substantially constant.

2. Apparatus as claimed in claim 1, wherein said first and second photodiodes have substantially the same characteristics as each other as regards sensitivity to said intensity of light emitted by said laser and sensitivity to said wavelength.

3. Apparatus as claimed in claim 2, further including:
   two logarithmic amplifiers respectively connected to the outputs of said first and second photodiodes;
   and a subtractor amplifier having positive and negative inputs connected, respectively, to the outputs of said logarithmic amplifiers to provide, at its output, said second output signal.

4. Apparatus as claimed in claim 3, wherein said means responsive to said second output signal comprises:
   a reference signal source;
   means coupled to said reference signal source and to subtractor amplifier to provide a control signal dependent upon the difference between said second output signal and said reference signal;
   and means responsive to said control signal to control said parameter to maintain said wavelength substantially constant.

5. Apparatus as claimed in claim 4, further comprising a heat sink on which said laser is mounted;
   wherein said controlled parameter is the operating temperature of said laser;
   and wherein said means responsive to said control signal comprises means to heat or cool said heat sink in dependence upon said control signal.

6. Apparatus as claimed in claim 1, wherein said means responsive to said second output signal comprises means to control the operating temperature of said laser.

7. In combination: a semiconductor laser; and apparatus for controlling the intensity and wavelength of light emitted by said laser, said wavelength being determined by an operating parameter of said laser; said apparatus comprising:
   means to supply drive current to said laser to cause said laser to emit light;
   first emission-responsive means to receive light emitted by said laser and to produce a first electrical output signal in dependence upon the intensity of said emitted light received thereby;
   current control means responsive to said first electrical output signal and coupled to said drive current supply means to control said drive current supplies to said laser to maintain said intensity of said emitted light substantially constant;
   second emission-responsive means to receive light emitted by said laser and to produce a second electrical output signal which varies in dependence upon said wavelength of said emitted light received thereby;
   a resonant cavity at the output of said laser;
   lens means and an optical grating in the path of said light emitted by said laser;
   and means to control the angle of said optical grating relative to the axis of said path under the control of said second output signal to maintain said wavelength of said emitted light substantially constant.

8. Apparatus as claimed in claim 7, wherein said means to control said angle of said optical grating comprises a piezo-electrical crystal.

* * * * *